United States Patent
Endo

(10) Patent No.: US 8,044,513 B2
(45) Date of Patent: Oct. 25, 2011

(54) SEMICONDUCTOR DEVICE AND SEMICONDUCTOR DEVICE MANUFACTURING METHOD

(75) Inventor: Masato Endo, Ashigarakami-gun (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/497,857

(22) Filed: Jul. 6, 2009

(65) Prior Publication Data

US 2010/0006946 A1 Jan. 14, 2010

(30) Foreign Application Priority Data

Jul. 14, 2008 (JP) .................................. 2008-183148

(51) Int. Cl.
*H01L 29/72* (2006.01)
(52) U.S. Cl. ........ 257/758; 257/314; 257/368; 257/370; 257/374; 257/401; 257/501; 257/506; 257/510
(58) Field of Classification Search .................. 257/314, 257/368, 370, 374, 401, 501, 506, 510, 758
See application file for complete search history.

(56) References Cited

U.S. PATENT DOCUMENTS

| 6,794,708 | B2  | 9/2004  | Mori et al.             |
|-----------|-----|---------|-------------------------|
| 6,921,947 | B2* | 7/2005  | Furuta et al. ... 257/368 |
| 7,122,866 | B2* | 10/2006 | Arai et al. ....... 257/370 |
| 7,298,005 | B2  | 11/2007 | Yoshikawa               |

FOREIGN PATENT DOCUMENTS

JP 2002-64157 2/2002
* cited by examiner

*Primary Examiner* — Edward Wojciechowicz
(74) *Attorney, Agent, or Firm* — Oblon, Spivak, McClelland, Maier & Neustadt, L.L.P.

(57) ABSTRACT

A semiconductor device includes a plurality of first MOS transistors has a first gate electrode formed on a first gate insulating film provided in a first transistor region on a semiconductor substrate, a plurality of second MOS transistors has a second gate electrode formed on a second gate insulating film which is provided in a second transistor region on the semiconductor substrate and which is smaller in thickness than the first gate insulating film, a first element isolation region in the first transistor region, the first element isolation region provided between the plurality of first MOS transistors, and a second element isolation region in the second transistor region, the second element isolation region provided between the plurality of second MOS transistors. The upper surface of the second element isolation region is lower than the upper surface of the first element isolation region.

13 Claims, 18 Drawing Sheets

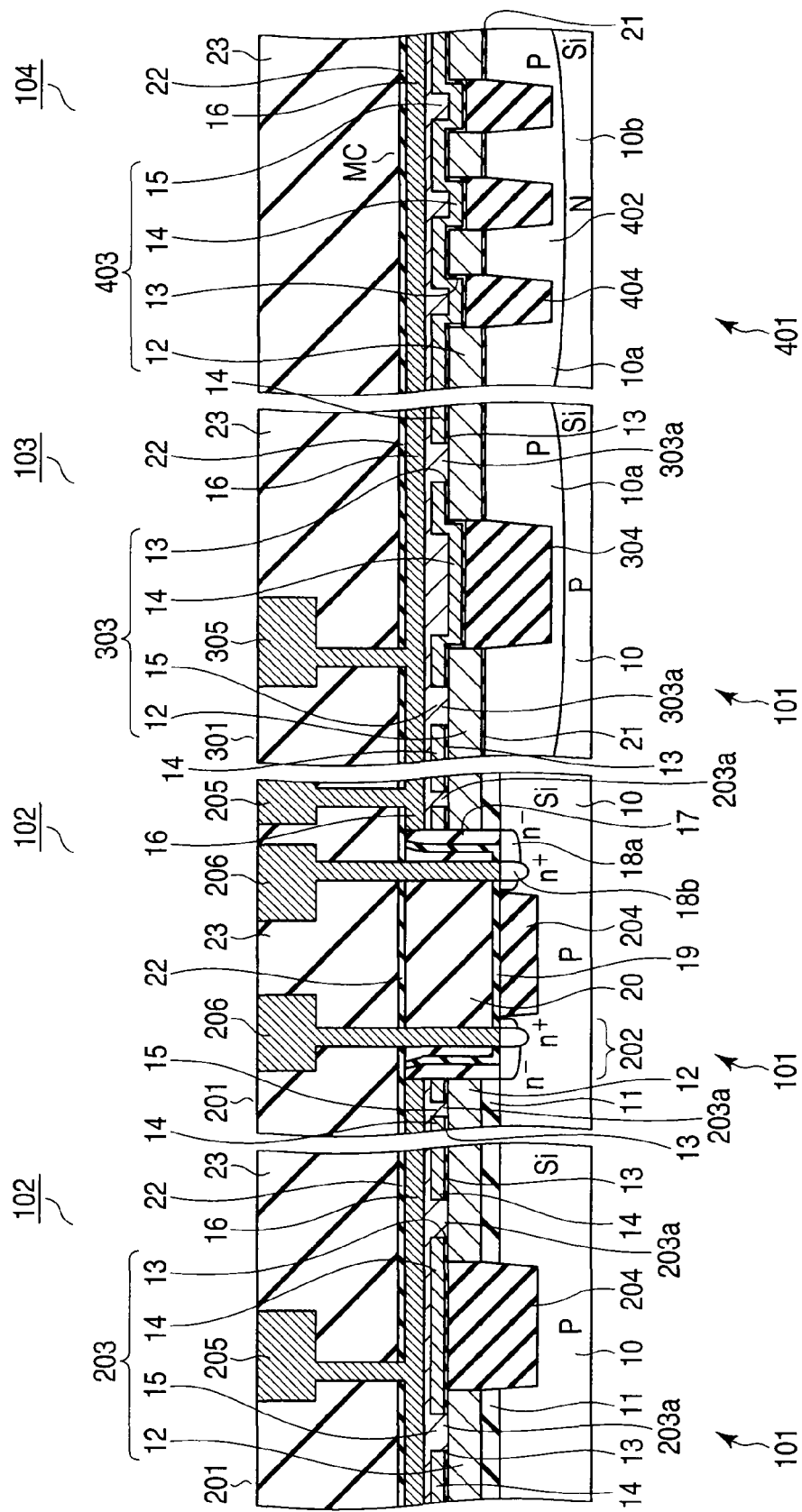

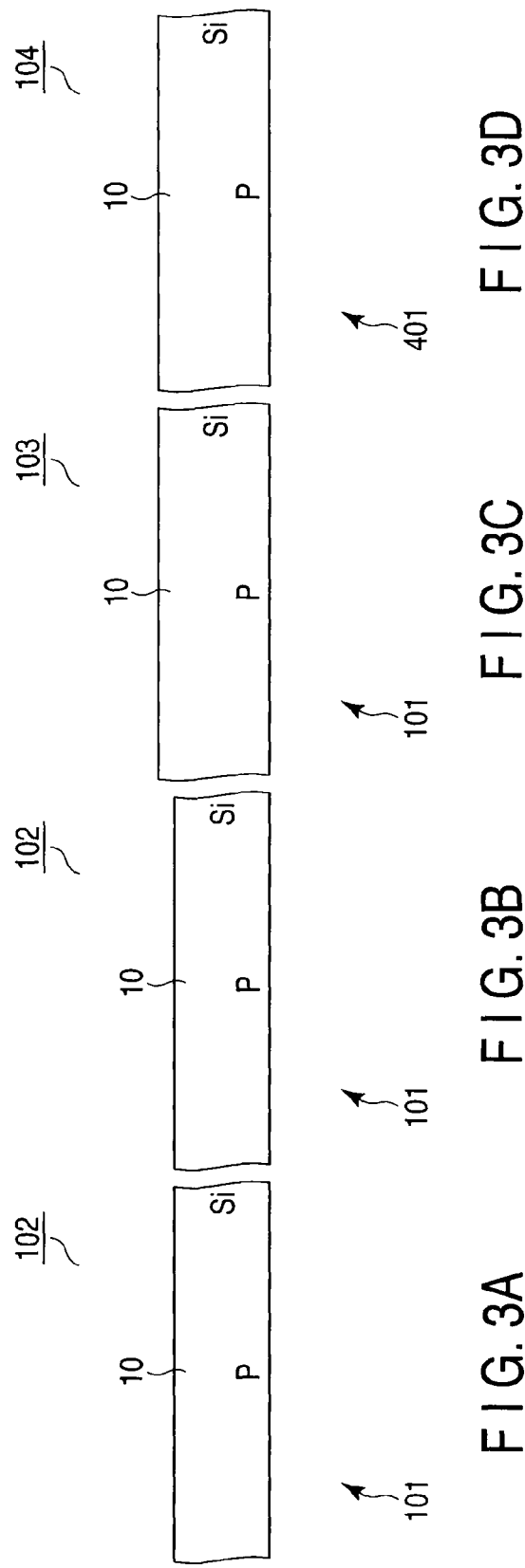

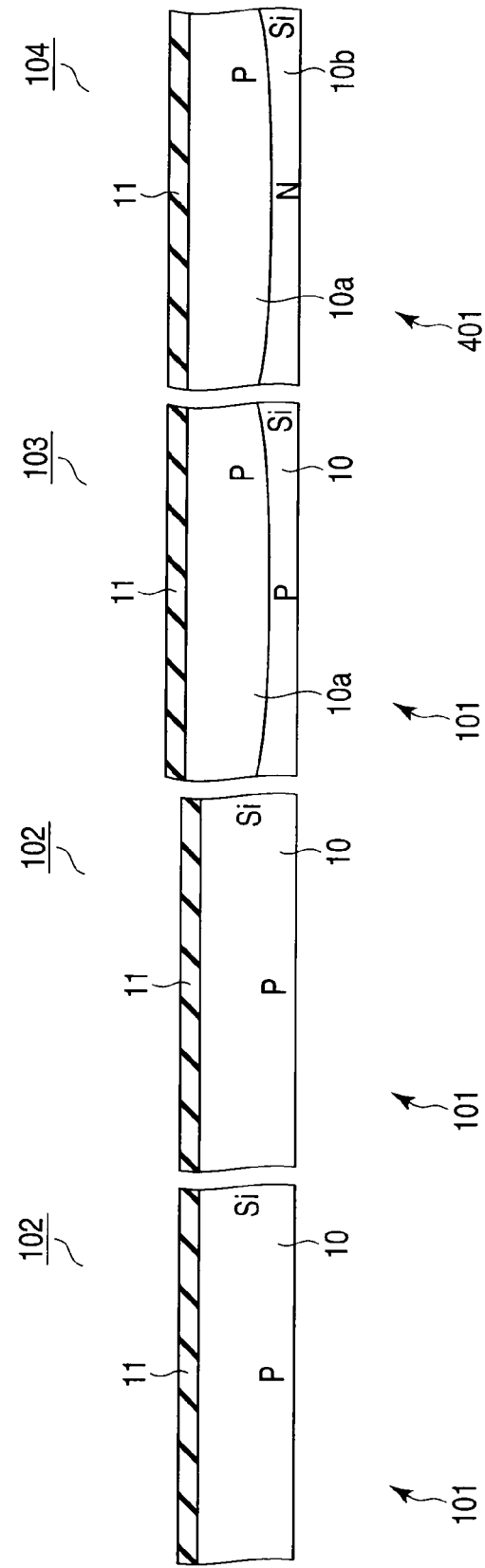

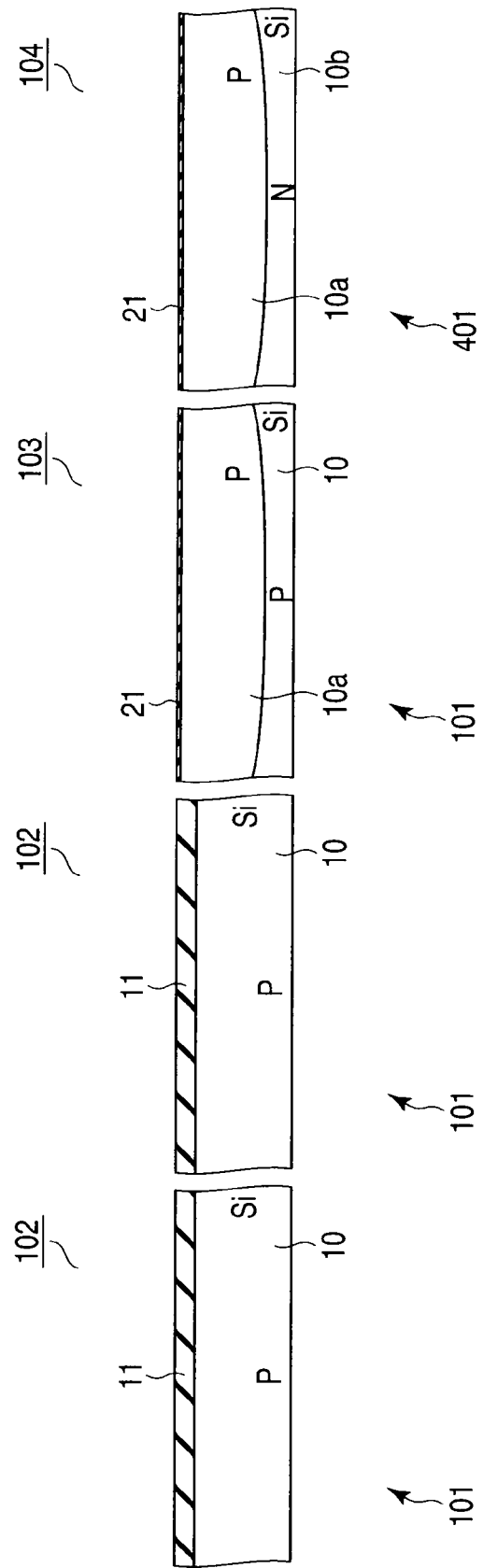

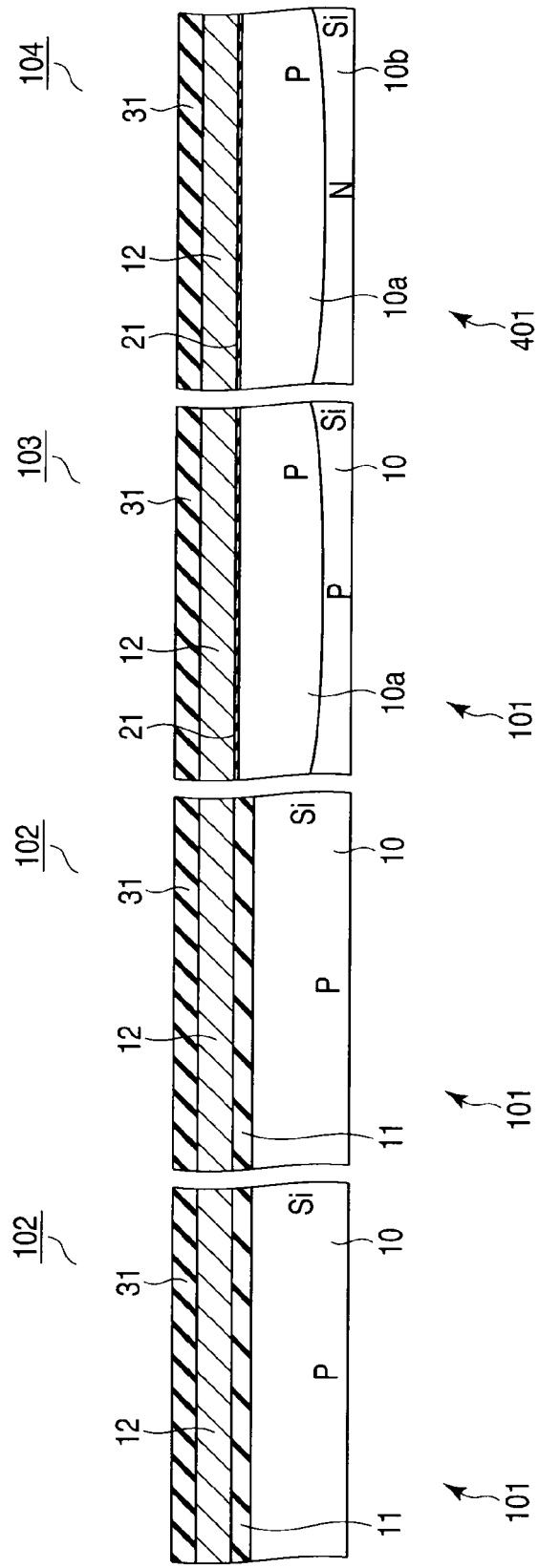

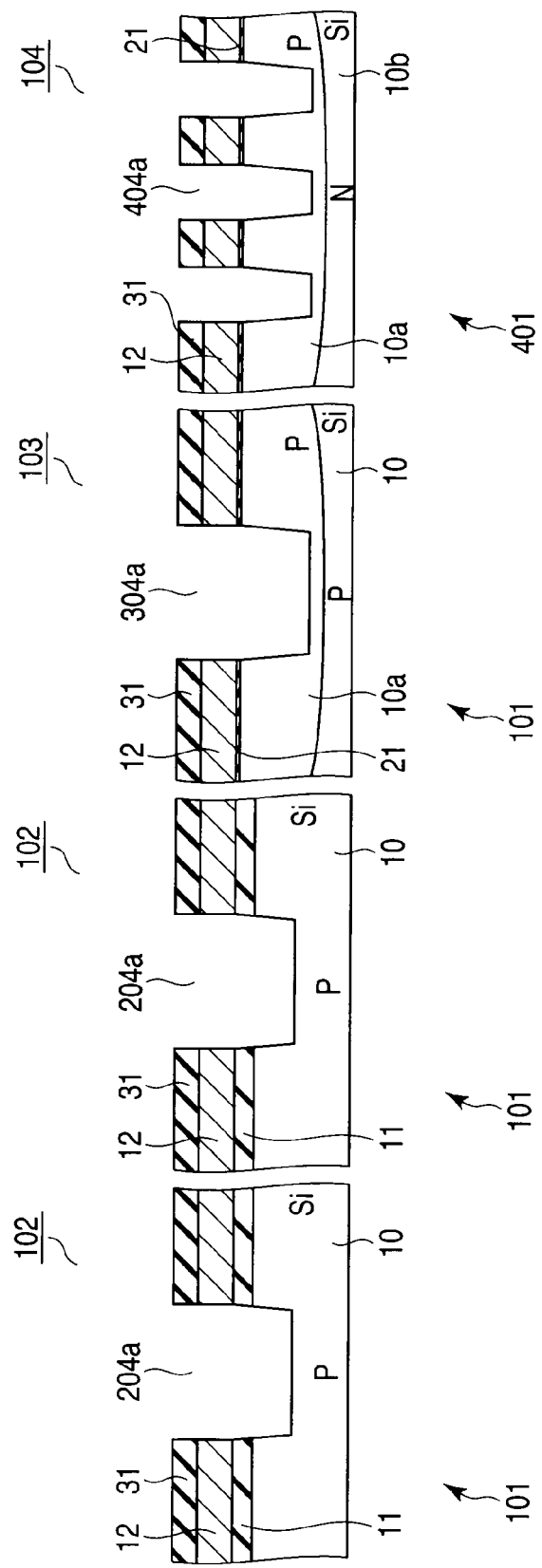

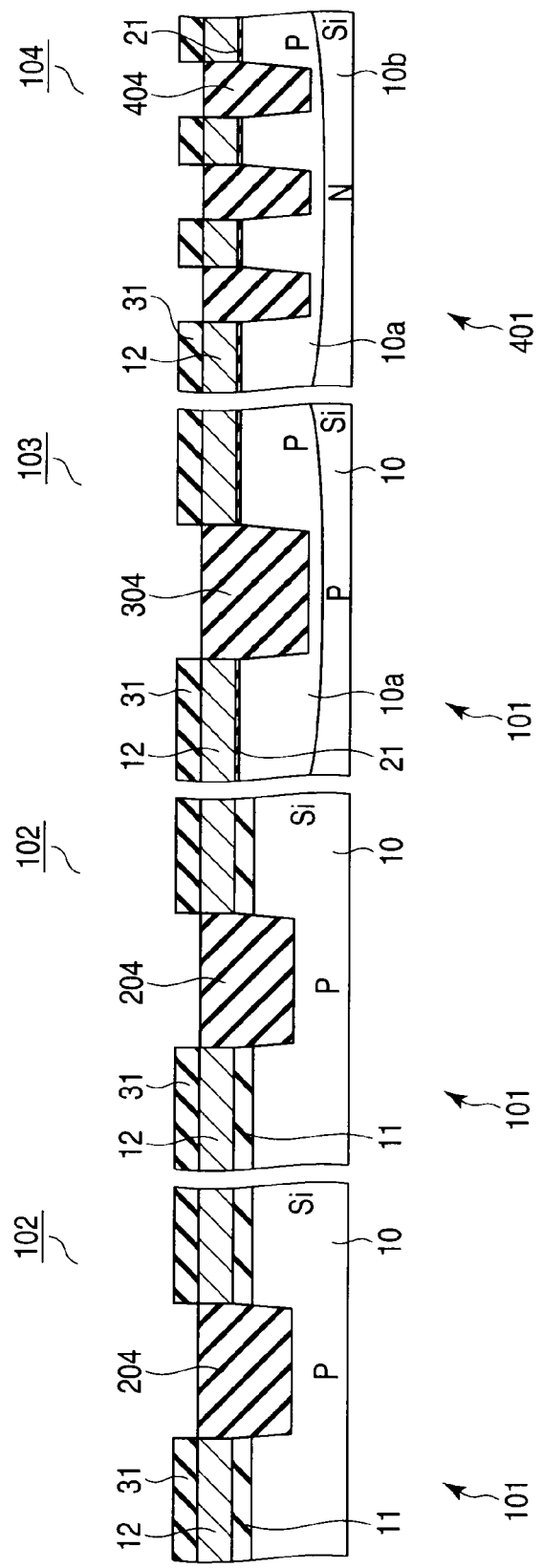

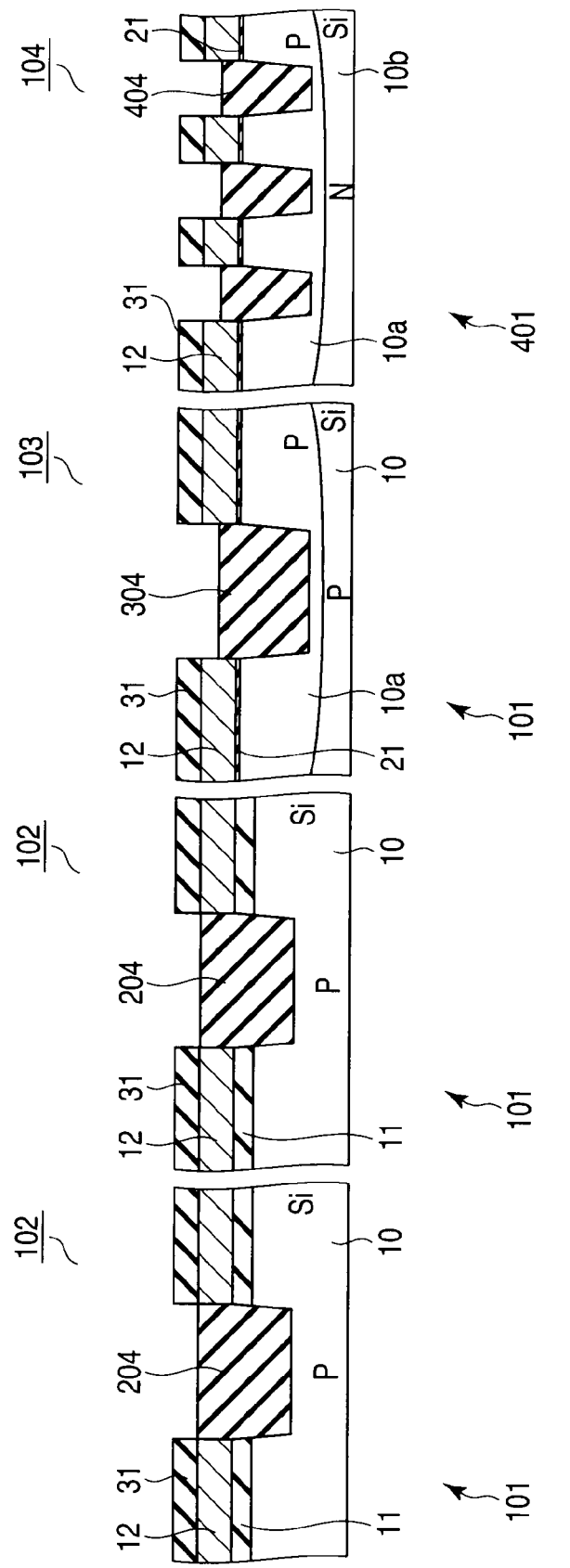

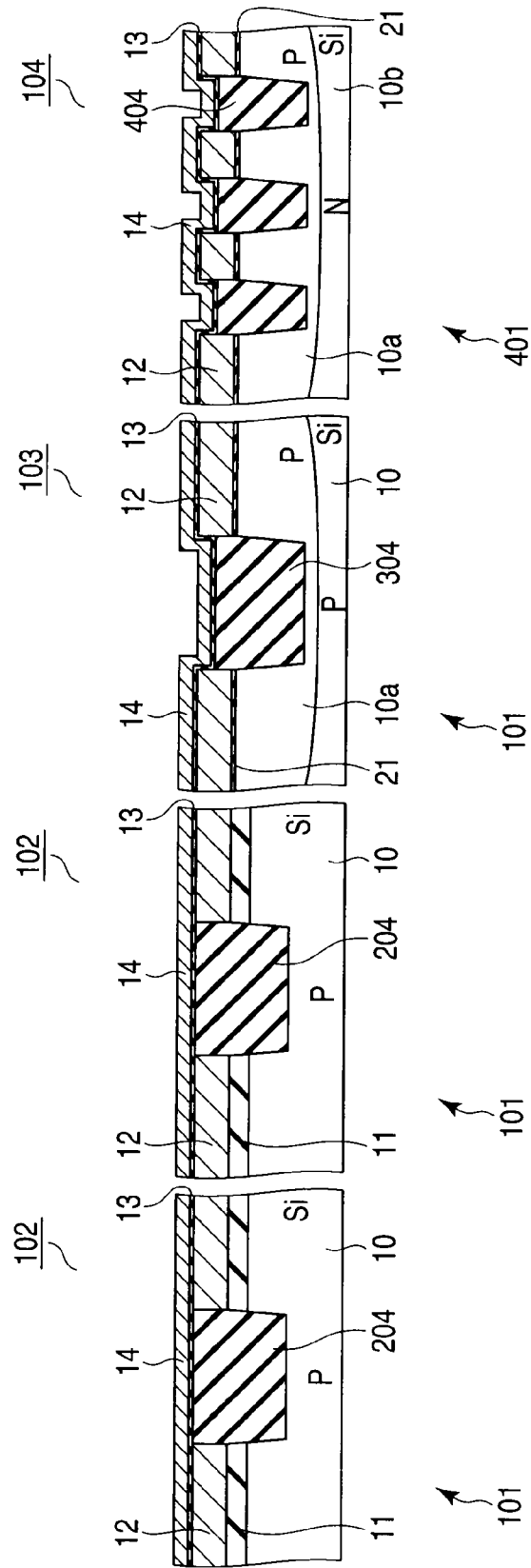

SEMICONDUCTOR DEVICE AND SEMICONDUCTOR DEVICE MANUFACTURING METHOD

CROSS-REFERENCE TO RELATED APPLICATIONS

This application is based upon and claims the benefit of priority from prior Japanese Patent Application No. 2008-183148, filed Jul. 14, 2008, the entire contents of which are incorporated herein by reference.

BACKGROUND OF THE INVENTION

1. Field of the Invention

The present invention relates to a semiconductor device and a manufacturing method thereof. More particularly, it relates to a nonvolatile semiconductor memory device which has a low-voltage (LV) transistor region and a high-voltage (HV) transistor region in a peripheral circuit section and which has a different element isolation structure in each of the regions.

2. Description of the Related Art

A NAND-type flash memory, for example, is a nonvolatile semiconductor memory device capable of electric rewriting (program and erase) of data. In this flash memory, a plurality of transistor circuits (peripheral circuit sections) are arranged around a memory cell section. The peripheral circuit sections of the flash memory are roughly classified into an LV transistor region and an HV transistor region.

A flash memory having such a configuration is already well known (see, for example, Jpn. Pat. Appln. KOKAI Publication No. 2002-064157).

Recently, element isolation regions have been shrinking in the NAND-type flash memory. In the future, a coating film of, for example, polysilazane (PSZ) may be used to fill a trench in the process of forming an embedded element isolation insulating film serving as shallow trench isolation (STI). That is, since the PSZ film has good coverage characteristics, it is embedded in an element isolation trench to form a micro STI.

However, the PSZ film has the property of being high in contraction stress. Thus, when the PSZ film is used for the STI of the peripheral circuit section, crystal defects tend to be happened in the LV transistor region, so that there is concern about problems such as a junction leakage. This problem is dependent on the amount of the PSZ film and can be alleviated by reducing the amount of the film, that is, by reducing the depth of the STI. However, as the STIs of the peripheral circuit sections are simultaneously formed in the LV transistor region and the HV transistor region, the reduction of the depth of the STI then leads to a problem such as an STI inversion leakage in the HV transistor region.

BRIEF SUMMARY OF THE INVENTION

According to a first aspect of the present invention, there is provided a semiconductor device comprising: a semiconductor substrate having a first transistor region and a second transistor region; a first gate insulating film and a second gate insulating film, the first gate insulating film being provided in the first transistor region on the semiconductor substrate, the second gate insulating film being provided in the second transistor region on the semiconductor substrate and being smaller in thickness than the first gate insulating film; a plurality of first metal oxide semiconductor (MOS) transistors formed on the first gate insulating film and each of the first MOS transistors has a first gate electrode; a plurality of second MOS transistors formed on the second gate insulating film and each of the second MOS transistors has a second gate electrode; a first element isolation region in the first transistor region, the first element isolation region being provided between the plurality of first MOS transistors; and a second element isolation region in the second transistor region, the second element isolation region being provided between the plurality of second MOS transistors, wherein the upper surface of the second element isolation region is lower than the upper surface of the first element isolation region.

According to a second aspect of the present invention, there is provided a semiconductor device comprising: a semiconductor substrate having a first transistor region, a second transistor region and a memory cell region; a first gate insulating film, a second gate insulating film and a third gate insulating film, the first gate insulating film being provided in the first transistor region on the semiconductor substrate, the second gate insulating film being provided in the second transistor region on the semiconductor substrate and being smaller in thickness than the first gate insulating film, the third gate insulating film being provided in the memory cell region on the semiconductor substrate and being equal in thickness to the second gate insulating film; a plurality of first metal oxide semiconductor (MOS) transistors formed on the first gate insulating film and each of the first MOS transistors has a first gate electrode; a plurality of second MOS transistors formed on the second gate insulating film and each of the second MOS transistors has a second gate electrode, the plurality second MOS transistors operating at a lower voltage than the plurality of first MOS transistors; a plurality of memory cell transistors on the third gate insulating film and having third gate electrode; a first element isolation region in the first transistor region, the first element isolation region being provided between the plurality of first MOS transistors; a second element isolation region in the second transistor region, the second element isolation region being provided between the plurality of second MOS transistors, a third element isolation region in the memory cell region, the third element isolation region being provided between the plurality of memory cell transistors, wherein the upper surface of the second element isolation region is lower than the upper surface of the first element isolation region.

According to a third aspect of the present invention, there is provided a semiconductor device manufacturing method comprising: forming a first gate insulating film in a first transistor region on a semiconductor substrate, and forming a second gate insulating film in a second transistor region on the semiconductor substrate so that an upper surface of the second gate insulating film is equal to an upper surface of the first gate insulating film, the second gate insulating film being smaller in thickness than the first gate insulating film; forming, in the first transistor region, a first trench, and forming, in the second transistor region, a second trench; embedding an insulating film in the first trench in the first transistor region to form a first element isolation region, and embedding the insulating film in the second trench in the second transistor region to form a second element isolation region; removing an upper part of the insulating film to make the upper surface of the second element isolation region is lower than an upper surface of the first element isolation region; and forming, a plurality of first metal oxide semiconductor (MOS) transistors in the first transistor region via the first gate insulating film, the plurality of first MOS transistors having first gate electrode a plurality of second MOS transistors in the second transistor region via the second gate insulating film, the plurality second MOS transistors having second gate electrode.

BRIEF DESCRIPTION OF THE SEVERAL VIEWS OF THE DRAWING

FIGS. 2A to 2D are sectional views showing the example of the configuration of the NAND-type flash memory according to the first embodiment;

FIGS. 3A to 3D are sectional views shown to explain the process of manufacturing the NAND-type flash memory according to the first embodiment;

FIGS. 4A to 4D are sectional views shown to explain the process of manufacturing the NAND-type flash memory according to the first embodiment;

FIGS. 5A to 5D are sectional views shown to explain the process of manufacturing the NAND-type flash memory according to the first embodiment;

FIGS. 6A to 6D are sectional views shown to explain the process of manufacturing the NAND-type flash memory according to the first embodiment;

FIGS. 7A to 7D are sectional views shown to explain the process of manufacturing the NAND-type flash memory according to the first embodiment;

FIGS. 9A to 9D are sectional views shown to explain the process of manufacturing the NAND-type flash memory according to the first embodiment;

FIGS. 10A to 10D are sectional views shown to explain the process of manufacturing the NAND-type flash memory according to the first embodiment;

FIGS. 11A to 11D are sectional views shown to explain the process of manufacturing the NAND-type flash memory according to the first embodiment;

DETAILED DESCRIPTION OF THE INVENTION

Embodiments of the present invention will be described with reference to the accompanying drawings. It should be noted that the drawings are schematic ones and so are not to scale. The following embodiments are directed to a device and a method for embodying the technical concept of the present invention, and the technical concept does not specify the material, shape, structure or configuration of components of the present invention. Various changes and modifications can be made to the technical concept without departing from the scope of the claimed invention.

First Embodiment

Figures 1A, 1B, 1C:
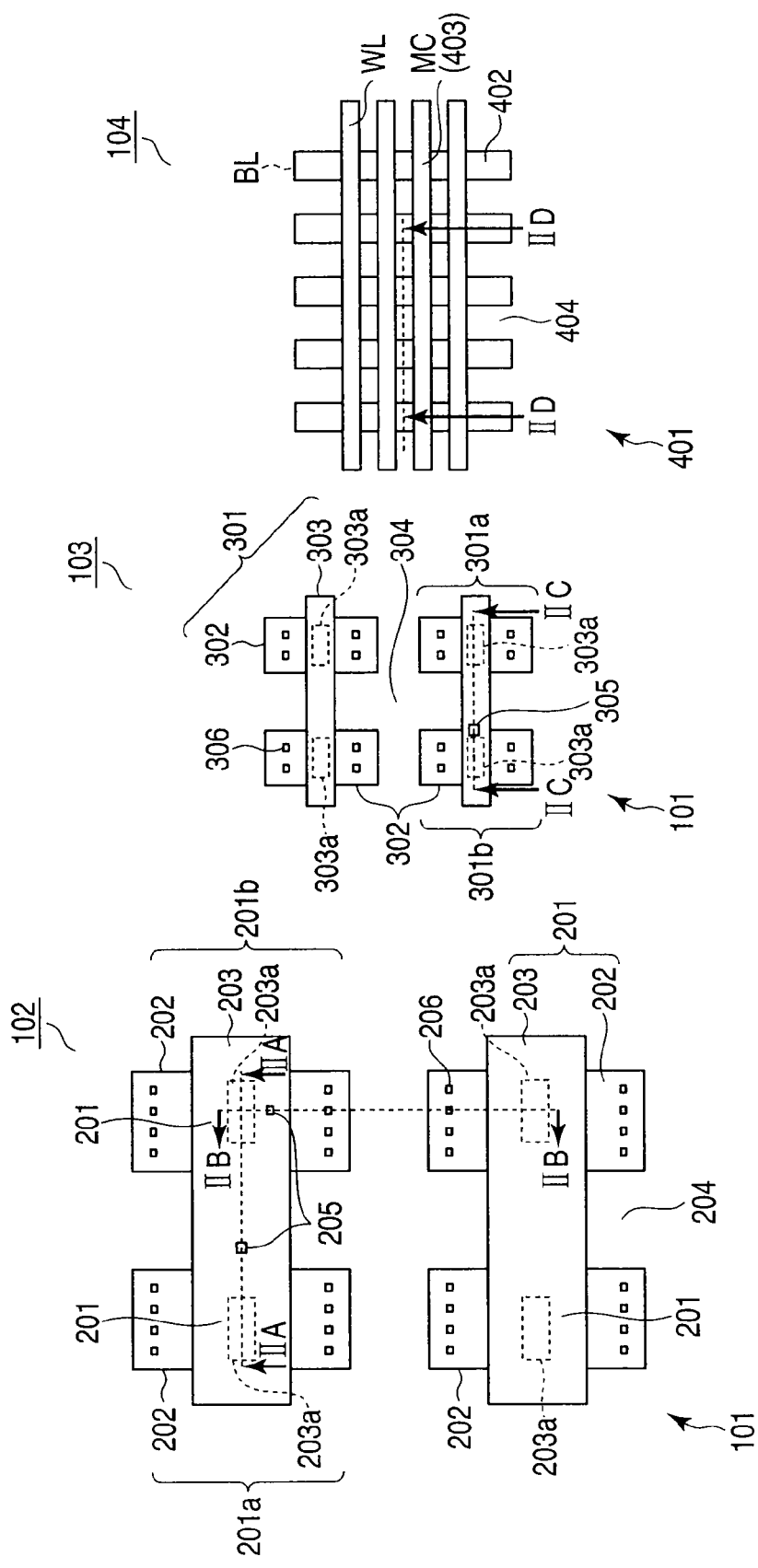
FIGS. 1A to 1C are plan views showing an example of the configuration of a semiconductor device (NAND-type flash memory) according to a first embodiment of the present invention.
Figures 8A, 8B, 8C, 8D:
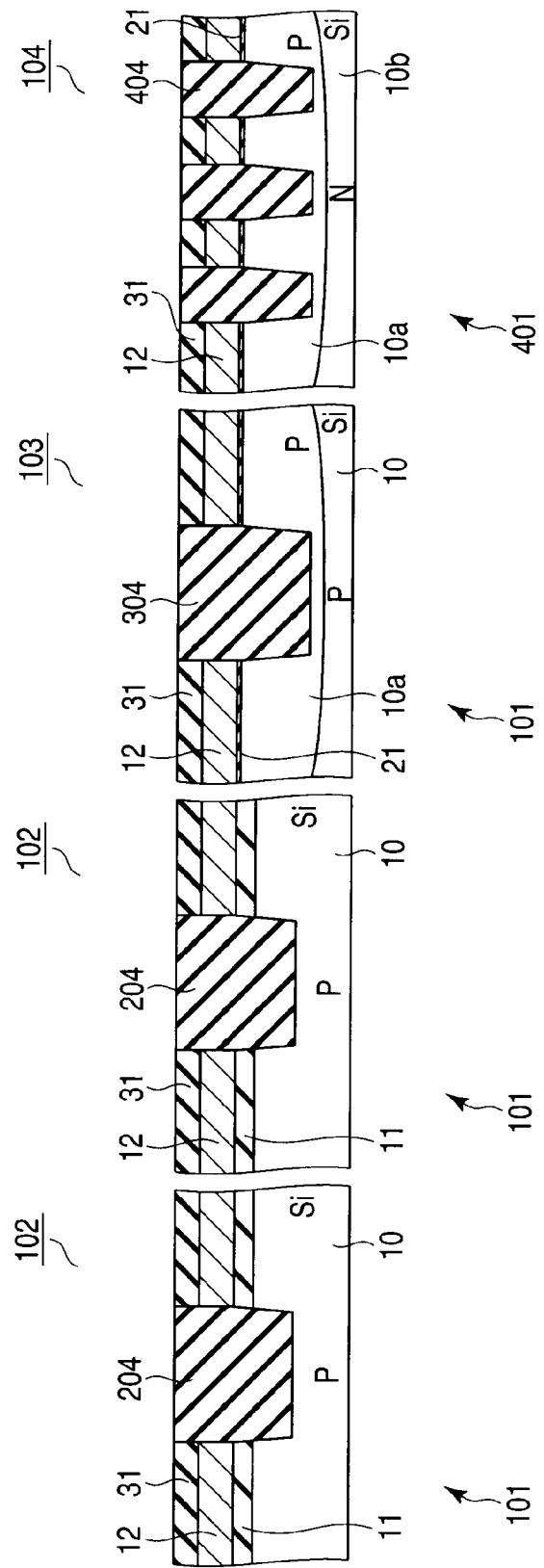
FIGS. 8A to 8D are sectional views shown to explain the process of manufacturing the NAND-type flash memory according to the first embodiment.
Figures 12A, 12B, 12C, 12D:
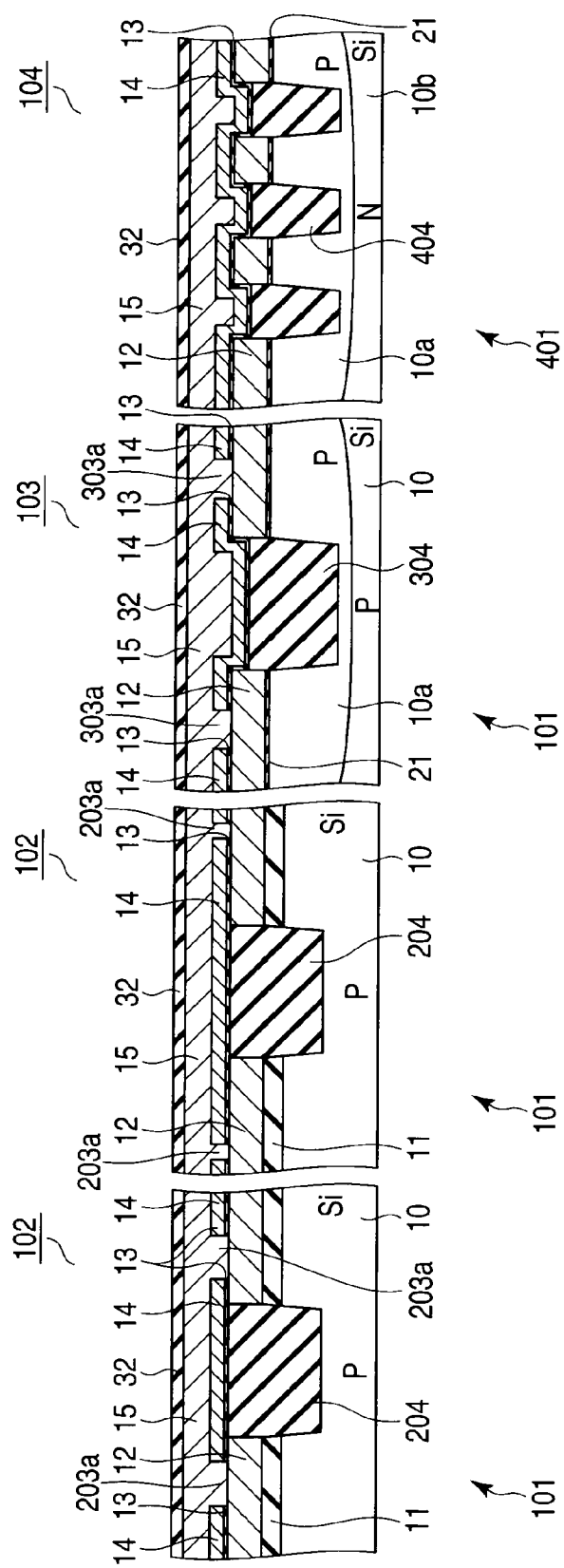
FIGS. 12A to 12D are sectional views shown to explain the process of manufacturing the NAND-type flash memory according to the first embodiment.
Figures 13A, 13B, 13C, 13D:
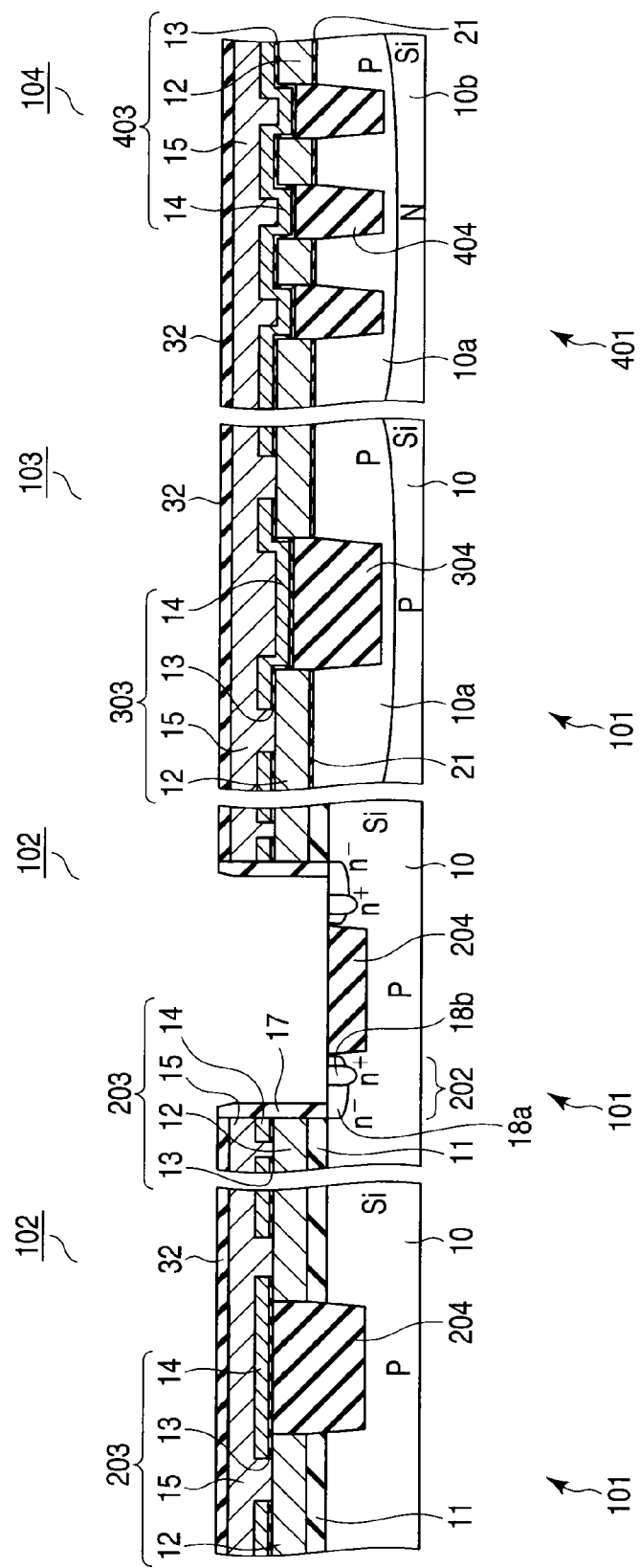
FIGS. 13A to 13D are sectional views shown to explain the process of manufacturing the NAND-type flash memory according to the first embodiment.
Figures 14A, 14B, 14C, 14D:
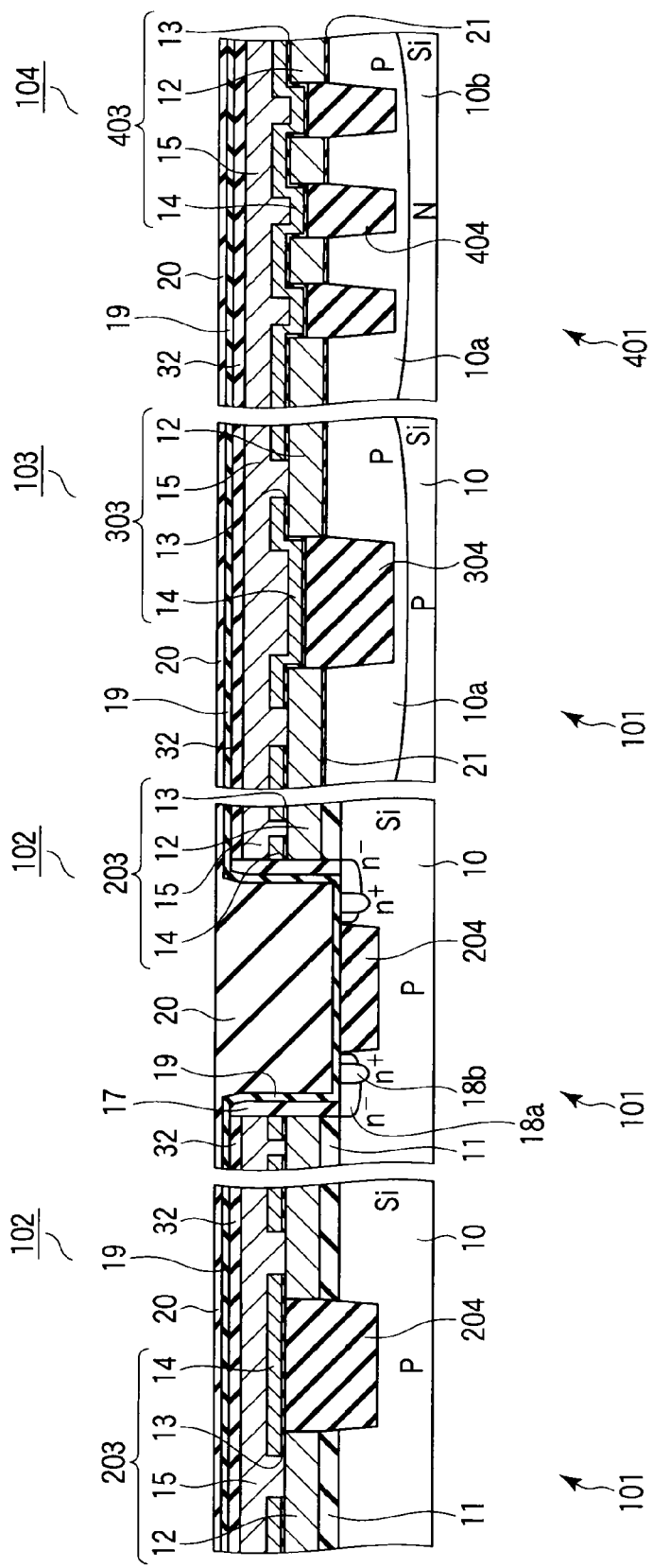
FIGS. 14A to 14D are sectional views shown to explain the process of manufacturing the NAND-type flash memory according to the first embodiment.
Figures 15A, 15B, 15C, 15D:
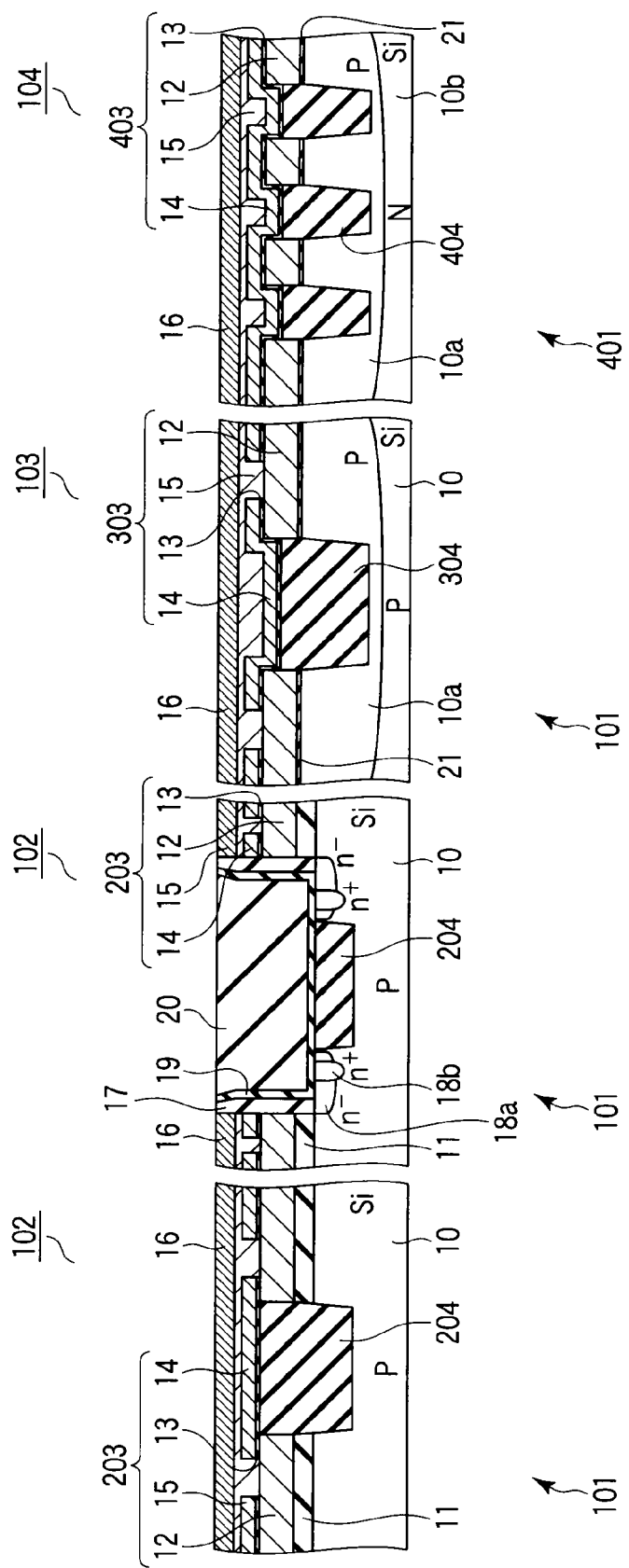
FIGS. 15A to 15D are sectional views shown to explain the process of manufacturing the NAND-type flash memory according to the first embodiment.
Figures 16A, 16B, 16C, 16D:
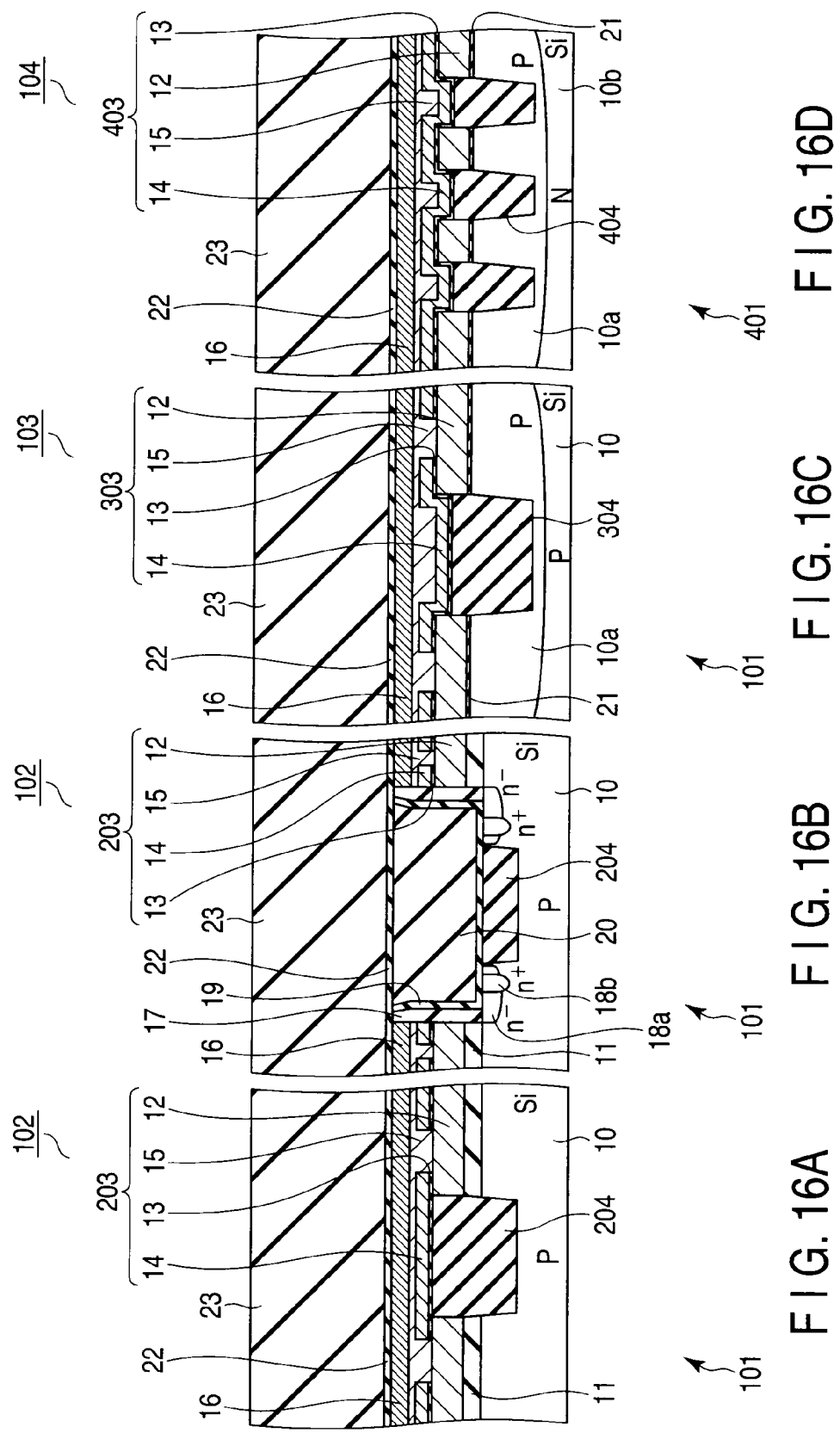
FIGS. 16A to 16D are sectional views shown to explain the process of manufacturing the NAND-type flash memory according to the first embodiment.
Figures 17A, 17B, 17C, 17D:
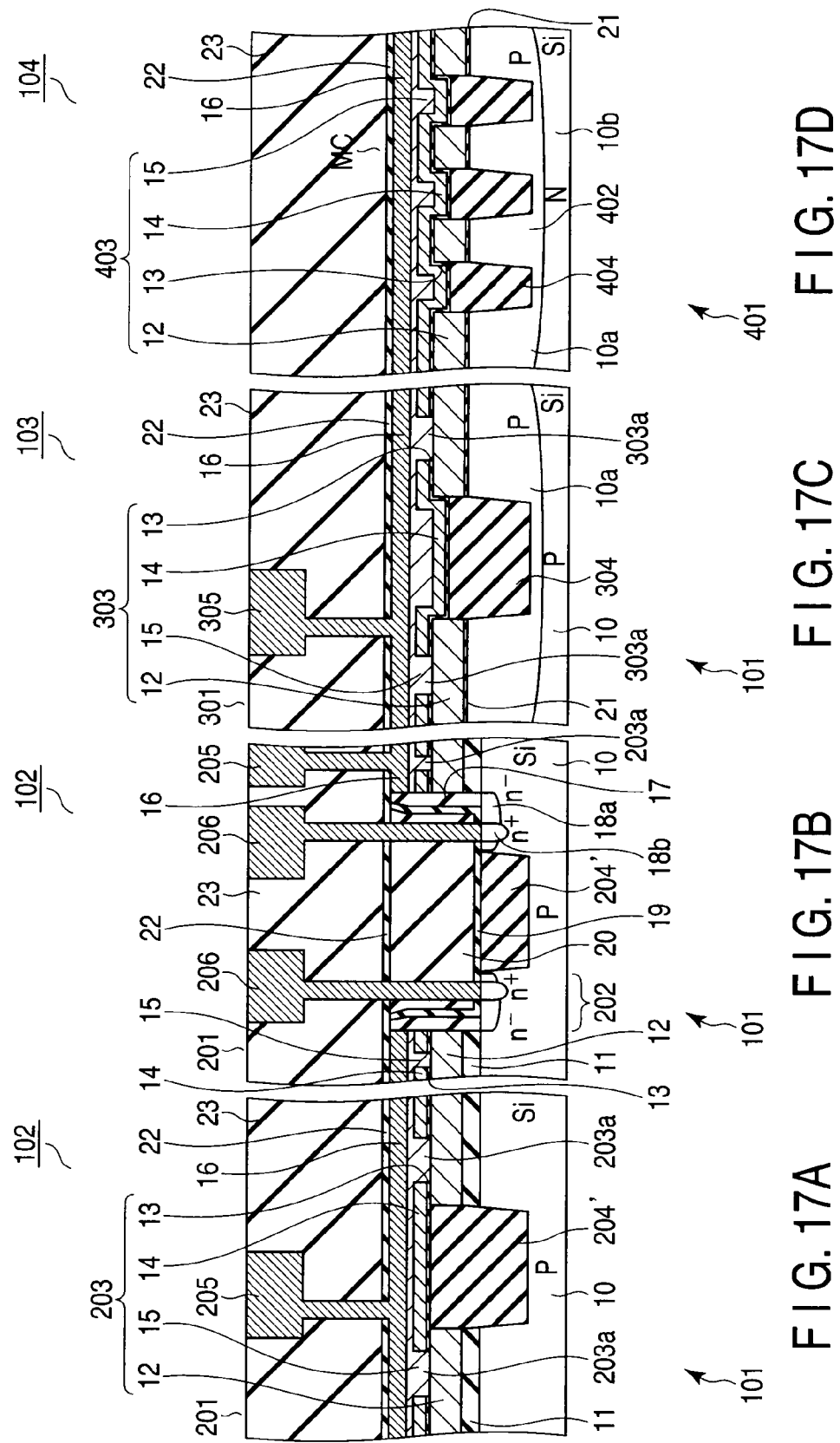
FIGS. 17A to 17D are plan views showing an example of the configuration of a semiconductor device (NAND-type flash memory) according to a second embodiment of the present invention.
Figures 18A, 18B, 18C, 18D:
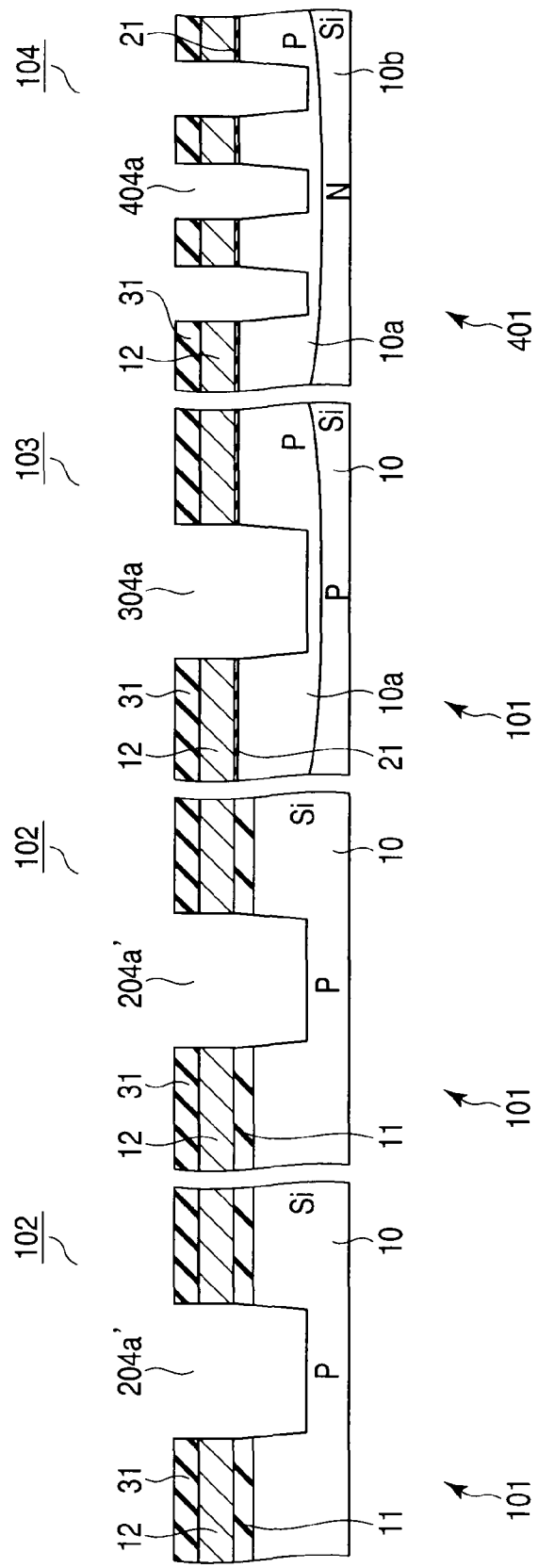
FIGS. 18A to 18D are sectional views shown to explain the process of manufacturing the NAND-type flash memory according to the second embodiment.

FIGS. 1A to 1C and FIGS. 2A to 2D show an example of the configuration of a semiconductor device according to a first embodiment of the present invention. In the present embodiment, a NAND-type flash memory, which is a nonvolatile semiconductor memory device, is described as an example of a semiconductor device having different element isolation structures in an LV transistor region and an HV transistor region. FIG. 1A is a plan view schematically showing an HV transistor region of a peripheral circuit section in a memory chip, FIG. 1B is a plan view schematically showing an LV transistor region of the peripheral circuit section, and FIG. 1C is a plan view schematically showing a memory cell section. FIG. 2A is a sectional view of the HV transistor region along the line IIA-IIA in FIG. 1A, FIG. 2B is a sectional view of the HV transistor region along the line IIB-IIB in FIG. 1A, FIG. 2C is a sectional view of the LV transistor region along the line IIC-IIC in FIG. 1B, and FIG. 2D is a sectional view of the memory cell section along the line IID-IID in FIG. 1C.

Here, a direction of the line IIA-IIA, the line IIC-IIC and the line IID-IID is referred to as a channel width direction, and a direction of the line IIB-IIB is referred to as a channel length direction. Further, the direction of the line IID-IID may be referred to as a word line (WL) direction. In comparison with the WL direction, a direction perpendicular to the line IID-IID is referred to as a bit line (BL) direction.

As shown in FIG. 1A, a plurality of HV transistors (in this example, n-type first metal oxide semiconductor (MOS) transistors) 201 are formed in an HV transistor region (first transistor region) 102 of a peripheral circuit section 101 on a chip. Each of the HV transistors 201 is disposed at the intersection of an element region 202 and a gate electrode unit 203. In this example, the gate electrode unit (first gate electrode unit) 203 is disposed across two element regions 202, thereby constituting a set (pair) of HV transistors 201 (201a, 201b). The element region 202 is enclosed by an element isolation region (STI) 204 which is formed by embedding a coating film (insulating film) such as a PSZ film having high contraction stress. Further, openings 203a are formed in the gate electrode unit 203. In addition, the HV transistors 201, 201 are generally arranged at random in the HV transistor region 102.

In a section along the line IIA-IIA, the STI 204 has its bottom in a P-type silicon (Si) substrate 10, and has its top projecting from the upper surface of the Si substrate 10. As shown in, for example, FIG. 2A, the gate electrode unit 203 of the HV transistor 201 is provided on the Si substrate 10 via a gate insulating film (first gate insulating film) 11 having a thickness of about 40 nm. In the gate electrode unit 203, an intergate insulating film (third insulating film) 13 and a second electrode film 14 having the opening 203a are formed on a first electrode film 12 in order from the bottom. The first electrode film 12 serves to form a floating gate electrode. The second electrode film 14 serves to form a first control gate electrode. On the second electrode film 14, a third electrode film 15 serving to form a second control gate electrode is formed. The third electrode film 15 is also connected to the first electrode film 12 via the opening 203a. Further, a metal salicide film 16 for resistance reduction is provided on the gate electrode unit 203.

In the channel width direction, the side surface of the STI 204 is in contact with the gate insulating film 11 and the first electrode film 12, and the upper surface of the STI 204 is substantially coincident with the upper surface of the first electrode film 12. The intergate insulating film 13 and the second electrode film 14 are partly located on the first electrode film 12, and are provided to cover the upper surface of the STI 204 between the element regions 202.

On the other hand, in a section along the line IIB-IIB, the intergate insulating film 13 and the second electrode film 14 that have the opening 203a are formed between the first electrode film 12 and the third electrode film 15 in the gate electrode unit 203. The first electrode film 12 and the third electrode film 15 are electrically connected together through the opening 203a.

As shown in, for example, FIG. 2B, a spacer film 17 formed of a fourth insulating film is provided along the sidewall of the gate electrode unit 203 on the Si substrate 10 corresponding to the element region 202. Diffusion layer regions 18a(n−), 18b(n+) having an LDD structure are formed on the surface part of the Si substrate 10 corresponding to the element region 202. A fifth insulating film 19 and a sixth insulating film 20 are formed on the STI 204 and the diffusion layer regions 18a, 18b between the gate electrode units 203, 203. The upper surface of the STI 204 in this section (IIB-IIB) is substantially equal in height to the upper surface of the Si substrate 10, but may be higher than the upper surface of the Si substrate 10.

As shown in FIG. 1B, a plurality of LV transistors (in this example, n-type second MOS transistors) 301 are formed in an LV transistor region (second transistor region) 103 of the peripheral circuit section 101 on the chip. Each of the LV transistors 301 is disposed at the intersection of an element region 302 and a gate electrode unit (second gate electrode unit) 303. In this example, the gate electrode unit 303 is disposed across two element regions 302, thereby constituting a set (pair) of LV transistors 301 (301a, 301b). The element region 302 is enclosed by an element isolation region (STI) 304 formed by embedding a coating film such as a PSZ film having high contraction stress. In addition, the LV transistors 301, 301 are generally arranged at random in the LV transistor region 103.

In a section along the line IIC-IIC, the STI 304 has its bottom in the Si substrate 10, and has its top projecting from the upper surface of the Si substrate 10. As shown in, for example, FIG. 2C, the gate electrode unit 303 of the LV transistor 301 is provided on the Si substrate 10 via a gate insulating film (second gate insulating film) 21 having a thickness of about 8 nm. In the present embodiment, a P-well region 10a is formed in the Si substrate 10 corresponding to the LV transistor region 103. As a result, the LV transistors 301, 301 are n-type MOS transistors having P-type diffusion layers. In addition, if an N-well region is formed instead of the P-well region 10a and a P-type diffusion layer is formed, the LV transistors 301, 301 are p-type MOS transistors. In the gate electrode unit 303, an intergate insulating film (third insulating film) 13 and a second electrode film 14 that have an opening 303a are formed on a first electrode film 12 in order from the bottom. The first electrode film 12 serves to form a floating gate electrode, and the second electrode film 14 serves to form a first control gate electrode. On the second electrode film 14, a third electrode film 15 serving to form a second control gate electrode is formed. The third electrode film 15 is also connected to the first electrode film 12 via the opening 303a. Further, a metal salicide film 16 for resistance reduction is provided on the gate electrode unit 303. The intergate insulating film 13 and the second electrode film 14 are partly located on the first electrode film 12, and are provided to cover the upper surface of the STI 304 between the element regions 302.

In the channel width direction, the side surface of the STI 304 is in contact with the gate insulating film 21 and the first electrode film 12, and the upper surface of the STI 304 is higher than the upper surface of the gate insulating film 21 and lower than the upper surface of the first electrode film 12. The upper surface of the gate insulating film 21 in this LV transistor region 103 is substantially equal in height to the upper surface of the gate insulating film 11 in the HV transistor region 102 described above.

As shown in FIG. 1C, a plurality of memory cell transistors MC are formed in a cell region (cell array) 104 of a memory cell section 401 on the chip. The memory cell transistor MC is a MOS transistor having a gate electrode unit (third gate electrode unit) 403 of a stack gate electrode structure, and each of the memory cell transistors MC is disposed at the intersection of a word line (control gate electrode) WL and a bit line BL. The gate electrode unit 403 includes a control gate electrode and a floating gate electrode. For example, a charge (electrons) is injected into or out of the floating gate electrode by an FN tunnel current such that data is rewritten (program and erase). In general, a condition in which electrons are injected into the floating gate electrode is "0" data, and a condition in which no electrons are injected is "1" data. The floating gate electrodes are provided to correspond to element regions 402, and the control gate electrode is disposed across the plurality of element regions 402. The element region 402 is enclosed by an element isolation region (STI) 404 formed by embedding a coating film such as a PSZ film having high contraction stress.

In a section in a WL line direction along the line IID-IID, the STI 404 has its bottom in the Si substrate 10, and has its top projecting from the upper surface of the Si substrate 10. As shown in, for example, FIG. 2D, the gate electrode unit 403 of the memory cell transistor MC has a stack configuration including: a first electrode film 12 as a floating gate electrode and which is provided on the Si substrate 10 via an gate insulating film (third gate insulating film) 21 as a tunnel insulating film having a thickness of about 8 nm; a second electrode film 14 as a first control gate electrode and which is provided via an intergate insulating film (third insulating film) 13 formed continuously from the upper surface and side surface of the first electrode film 12 onto the STI 404; and a third electrode film 15 as a second control gate electrode. A metal salicide film 16 for resistance reduction is provided on the gate electrode unit 403.

In the channel length direction (BL direction), the side surface of the STI 404 is in contact with the gate insulating film 21 and the first electrode film 12, and the upper surface of the STI 404 is higher than the upper surface of the gate insulating film 21 and lower than the upper surface of the first electrode film 12.

Furthermore, the upper surface of the Si substrate 10 in the cell region 104 is substantially equal in height to the upper surface of the Si substrate 10 in the LV transistor region 103 described above. Thus, the upper surfaces of the gate insulating films 21 in the LV transistor region 103 and the cell region 104 coincide in height with each other. In addition, a P-well region 10a is formed in the Si substrate 10 corresponding to the cell region 104. Moreover, an N-well region 10b is formed under the P-well region 10a.

In general, in the NAND-type flash memory, a plurality of memory cell transistors MC are connected in series. One end of this cell sequence is connected to the bit line BL via a drain side select transistor, and the other end is connected to a source line via a source side select transistor.

In the HV transistor region 102, a contact (upper wiring line) 205 and a contact (upper wiring line) 206 are formed. The contact 205 penetrates a seventh insulating film 22 and an eighth insulating film 23, and contacts to the metal salicide film 16. The contact 206 penetrates the fifth insulating film 19, the sixth insulating film 20, the seventh insulating film 22 and the eighth insulating film 23, and contacts to the diffusion layer region 18b.

Furthermore, a contact (upper wiring line) 305 is formed in the LV transistor region 103. The contact 305 penetrates the seventh insulating film 22 and the eighth insulating film 23, and contacts to the metal salicide film 16.

In addition, instead of having the single-layer PSZ film, the STIs 204, 304, 404 may have, for example, a double-layer structure. The double-layer structure includes an insulating film such as a silicon oxide film is formed in the part in contact with the Si substrate 10 and PSZ film formed on the insulating film.

The characteristics of the NAND-type flash memory in the present embodiment are described below in detail. The NAND-type flash memory in the present embodiment has different element isolation structures in the HV transistor region 102 and the LV transistor region 103. That is, the upper surface of the STI 204 in the HV transistor region 102 is higher than the upper surface of the STI 304 in the LV transistor region 103. Moreover, the bottom surface of the STI 204 is located higher than the bottom surface of the STI 304 by the difference of thickness between the gate insulating film 11 and the gate insulating films 21. On the other hand, the upper surface of the STI 304 in the LV transistor region 103 is located lower than the topmost surface of the STI 204 in the HV transistor region 102 by the thickness of the intergate insulating film 13 and the second electrode film 14. Consequently, in the HV transistor region 102, a distance from the second electrode film 14 located on the upper surface of the STI 204 to the bottom of the STI 204 can keep large, and an STI inversion leakage can be reduced. In contrast, in the LV transistor region 103, the STI 304 can be made so shallow as to prevent the production of crystal defects (compared with the case of the upper surface of the STI 304 is equal to the upper surface of the STI 204, a sectional area of the STI 304 or a volume of the STI 304 is can be smaller).

The gate length of the HV transistor 201 is 1 μm to 10 μm and large so that the HV transistor 201 may not break down even if a high voltage is applied across the source and drain of the element region 202. On the other hand, the gate length of the LV transistor 301 is 0.15 μm to 0.5 μm and small for high-speed operation. That is, in the channel length direction, the element region 202 of the HV transistor 201 is longer than the element region 302 of the LV transistor 301. Therefore, the HV transistor 201 has a resistant to the stress of the PSZ film, and crystal defects are not easily produced in the HV transistor 201 even if the sectional area of the STI 204 in the channel length direction is increased.

Moreover, the upper surfaces of the gate insulating films 11, 21 are substantially equal in height. Thus, the gate electrode unit 203 of the HV transistor 201, the gate electrode unit 303 of the LV transistor 301, and the gate electrode unit 403 of the memory cell transistor MC are formed to be equal in height. Consequently, the lower surfaces of the eighth insulating film 23, etc. are flat, and a process margin is improvement.

Next, a method of manufacturing such NAND-type flash memory is described with reference to FIGS. 3A to 3Dthrough FIGS. 16A to 16D. In addition, "A" of each figure is a sectional view corresponding to FIG. 2A, "B" of each figure is a sectional view corresponding to FIG. 2B, "C" of each figure is a sectional view corresponding to FIG. 2C, and "D" of each figure is a sectional view corresponding to FIG. 2D.

As shown in FIGS. 3A to 3D, the upper surface of the Si substrate 10 corresponding to the HV transistor region 102 is etched so that each upper side of the gate electrode unit 203 of the HV transistor 201, the gate electrode unit 303 of the LV transistor 301, and the gate electrode unit 403 of the memory cell transistor MC is uniform.

As shown in FIGS. 4A to 4D, a first insulating film such as a silicon oxide film serving as the gate insulating film 11 of the HV transistor 201 is deposited with a thickness of about 40 nm on the entire surface of the Si substrate 10. In addition, before and after the formation of the first insulating film, the P-well regions 10a are formed on the surface parts of the Si substrate 10 corresponding to the LV transistor region 103 and the cell region 104. Further, the N-well region 10b is formed under the P-well region 10a in the cell region 104. When the LV transistor 301 is a p-type transistor, an N-well region is formed instead of the P-well region 10a.

As shown in FIGS. 5A to 5D, the first insulating film formed on the upper surface of the Si substrate 10 corresponding to the LV transistor region 103 and the cell region 104 is removed by a lithographic technique and an etching technique. Further, a second insulating film such as a silicon oxide film as the gate insulating film 21 of the LV transistor 301 is formed with a thickness of about 8 nm on the upper surface of the Si substrate 10 in the LV transistor region 103. In the meantime, a second insulating film serving as the gate insulating film (tunnel insulating film) 21 of the memory cell transistor MC is formed with a thickness of about 8 nm on the upper surface of the Si substrate 10 in the cell region 104.

As shown in FIGS. 6A to 6D, the first electrode film 12 of, for example, polysilicon as the floating gate electrode of the memory cell transistor MC is deposited all over the surface. On the first electrode film 12, a first mask material 31 such as a silicon nitride film to form the STIs 204, 304, 404 is deposited.

As shown in FIGS. 7A to 7D, element isolation trenches 204a, 304a, 404a to form the STIs 204, 304, 404 are formed by the lithographic technique and the etching technique.

Here, when the etching is performed with selectivity between the gate insulating films 11, 21 and the Si substrate 10, for example, if the etching rate of the Si substrate 10 is higher than the etching rate of the gate insulating films 11, 21, the positions of the bottom surfaces of the element isolation trenches 304a, 404a are about the same in the LV transistor region 103 and the cell region 104. In addition, as the etching rate decreases when the width of the element isolation trench is smaller, the bottom surface of the element isolation trench 404a in the cell region 104 may be shallower than the bottom surface of the element isolation trench 304a in the LV transistor region 103. Thus, "the positions of the bottom surfaces of the element isolation trenches 304a, 404a are about the same in the LV transistor region 103 and the cell region 104" means the case where the LV transistor region 103 and the cell region 104 are simultaneously etched under the same condition.

On the other hand, the bottom surface of the element isolation trench 204a in the HV transistor region 102 is shallower than the bottom surface of the element isolation trench 304a in the LV transistor region 103 because the thickness of the gate insulating film 11 is greater than the thickness of the gate insulating film 21. For example, when the etching rate of the Si substrate 10 is twice as high as the etching rate of the gate insulating films 11, 21, the bottom of the element isolation trench 204a is shallower than the bottom of the element isolation trench 304a by the difference of thickness (in this example, about 30 nm) between the gate insulating films 11, 21.

As shown in FIGS. 8A to 8D, the coating films such as PSZ films are embedded in the element isolation trenches 204a, 304a, 404a, and the STI 204 in the HV transistor region 102, the STI 304 in the LV transistor region 103 and the STI 404 in the cell region 104 is formed by a CMP process using the mask material 31 as a stopper.

As shown in FIGS. 9A to 9D, the upper surfaces of the STIs 204, 304, 404 are aligned in height with the upper surface of the first electrode film 12 by etching.

As shown in FIGS. 10A to 10D, the upper part of the STI 304 in the LV transistor region 103 and the upper part of the STI 404 in the cell region 104 are etched. As a result, the upper surfaces of the STI 304 and the STI 404 become lower than the upper surface of the first electrode film 12 (etch-back process). In this case, the HV transistor region 102 is covered with, for example, a photoresist, so that the upper part of the STI 204 is not etched.

The point of the present embodiment is that the upper surface of the STI 304 in the LV transistor region 103 is lower than the upper surface of the first electrode film 12 similarly to the upper surface of the STI 404 in the cell region 104. That is, the upper surface of the STI is lower than the upper surface of the first electrode film in the cell region to increase the coupling capacitance. However, the production of crystal defects in the LV transistor region has become a problem due to the use of, for example, the PSZ film having high contraction stress for the element isolation insulating film. Thus, the upper surface of the STI in the LV transistor region is also made lower than the upper surface of the first electrode film similarly to the upper surface of the STI in the cell region.

As shown in FIGS. 11A to 11D, after the first mask material 31 is removed, a third insulating film to form the intergate insulating film 13 in the memory cell transistor MC and the second electrode film 14 to form the first control gate electrode in the memory cell transistor MC are deposited in order all over the surface.

As shown in FIGS. 12A to 12D, in order to electrically connect the first, second electrode films 12, 14 to the third electrode film 15 serving as the second control gate electrode in the memory cell transistor MC to be formed in the subsequent step, the second electrode film 14 and the third insulating film 13 in the HV transistor region 102 and the LV transistor region 103 are partly removed to form openings 203a, 303a. Subsequently, the third electrode film 15 and an insulating film 32 are deposited in order all over the surface.

As shown in FIGS. 13A to 13D, the gate electrode unit 203 of the HV transistor 201, the gate electrode unit 303 of the LV transistor 301, and the gate electrode unit 403 of the memory cell transistor MC are processed (patterned) by the lithographic technique and the etching technique. Moreover, as shown in, for example, FIG. 13B, an N-type impurity is implanted into the surface part of the Si substrate 10 corresponding to the element region 202 to form the diffusion layer region 18a. After the fourth insulating film is deposited, the spacer film 17, which is a gate sidewall structure of the HV transistor 201, is formed on the sidewall of the gate electrode unit 203 by an anisotropic etching technique (the spacer film, which is the gate sidewall structure, is also formed in the gate electrode unit 303 of the LV transistor 301 in the same manner). Subsequently, an N-type impurity is selectively implanted into the surface part of the Si substrate 10 to form the diffusion layer region 18b.

In addition, as the fourth insulating film, it is preferable to use an insulating film which can provide a desired etching selectivity among the first electrode film 12, the second electrode film 14 and the third electrode film 15. When a p-type transistor is to be formed, a P-type impurity may be implanted instead of the N-type impurity.

As shown in FIGS. 14A to 14D, the fifth insulating film 19 and the sixth insulating film 20 are deposited in order all over the surface.

As shown in FIGS. 15A to 15D, the insulating film 32, the fifth insulating film 19 and the sixth insulating film 20 on the gate electrode units 203, 303 of the HV transistor 201 and the LV transistor 301 and on the gate electrode unit 403 of the memory cell transistor MC are detached by the etching technique. Subsequently, the metal salicide film 16 is formed.

As shown in FIGS. 16A to 16D, the seventh insulating film 22 and the eighth insulating film 23 are deposited in order all over the surface.

After a general contact formation step and wiring line formation step, a NAND-type flash memory having the configuration shown in FIGS. 1A to 1C and FIGS. 2A to 2D is completed. That is, the contact 205 and the contact 206 are formed in the HV transistor region 102, wherein the contact 205 penetrates the seventh insulating film 22 and the eighth insulating film 23 and is coupled to the metal salicide film 16, while the contact 206 penetrates the fifth insulating film 19, the sixth insulating film 20, the seventh insulating film 22 and the eighth insulating film 23 and is coupled to the diffusion layer region 18b. In the LV transistor region 103, the contact 305 is formed which penetrates the seventh insulating film 22 and the eighth insulating film 23 and which is coupled to the metal salicide film 16. In the cell region 104, a source line contact, a source line, a bit line contact, a bit line, etc. that are not shown are formed.

As described above, when a coating film such as the PSZ film having high contraction stress is used for the embedded element isolation insulating film in the process of simultaneously forming the STI in the HV transistor region and the STI in the LV transistor region, the embedded element isolation insulating film in the LV transistor region of the peripheral circuit section is etched back. Then, the upper surface of the STI in the LV transistor region is made lower than the upper surface of the first electrode film similarly to the upper surface of the STI in the cell region. In other words, the upper surface of the STI in the LV transistor region is made lower than the upper surface of the STI in the HV transistor region. Thus, although there is a difference of depth substantially equal to the difference of thickness between the gate insulating film of the HV transistor and the gate insulating films of the LV transistor. Then, it is possible to form the STI in the LV transistor region whose upper surface is lower than the upper surface of the STI in the HV transistor region by the embedded element isolation insulating film which has been etched back. Accordingly, the thickness (amount) of the embedded element isolation insulating film in the STI in the LV transistor region can be reduced by the amount of etch-back. Thus, the contraction stress can be reduced, and the production of crystal defects in the LV transistor region can be inhibited. Moreover, in the HV transistor region, the STI inversion leakage can be reduced such as the embedded element isolation insulating film having a sufficient thickness.

Furthermore, the height of the embedded element isolation insulating film in the LV transistor region of the peripheral circuit section is reduced simultaneously with the etch-back of the embedded element isolation insulating film in the cell region, so that it is possible to easily manufacture a NAND-type flash memory having different element isolation structures in the LV transistor region and the HV transistor region.

Second Embodiment

FIGS. 17A to 17D show an example of the configuration of a semiconductor device according to a second embodiment of the present invention. In the present embodiment, a NAND-type flash memory which is a nonvolatile semiconductor memory device is described as an example of a semiconductor device having different element isolation structures in an LV transistor region and an HV transistor region. It should be noted that, in the case of the present embodiment, etching conditions for a gate insulating film and an Si substrate in forming an element isolation trench are changed. It should also be noted that the same signs are provided to the same parts as in the first embodiment and detailed explanations are omitted.

That is, in the configuration of the NAND-type flash memory in the present embodiment, the bottom surface (the height of the lower surface) of an STI 204' in an HV transistor region (first transistor region) 102 is equal in height to the bottom surface of an STI 304 in an LV transistor region (second transistor region) 103 (the bottom surface of an STI 404 in a cell region 104 is also equal in height).

The upper surface of the STI 204' in the HV transistor region 102 is higher than the upper surface of the STI 304 in the LV transistor region 103 by the amount of etch-back of the STI 304. That is, a height of the STI 204' is higher than a height of the STI 304 by the difference of height between the upper surface of the STI 204' and the upper surface of the STI 304. Similarly, the height of the STI 204' is higher than a height of an STI 404 by the difference of height between the upper surface of the STI 204' and the upper surface of the STI 404. However, as the etching rate decreases when the width of the element isolation trench is smaller, "the STI 204' is greater in height than the STI 404 by the difference of height between the upper surface of the STI 204' and the upper surface of the STI 404" means at least the case where the HV transistor region 102 and the cell region 104 are simultaneously etched under the same condition.

FIGS. 18A to 18D show a manufacturing method in the case of forming element isolation trenches equal in the height of lower surfaces. It should be noted that the present embodiment is similar to the first embodiment in the steps from FIGS. 3A to 3D through FIGS. 6A to 6D and these steps are therefore not described. It should also be noted that FIG. 18A corresponds to FIG. 7A used in the explanation of the first embodiment, FIG. 18B corresponds to FIG. 7B, FIG. 18C corresponds to FIG. 7C, and FIG. 18D corresponds to FIG. 7D.

For example, as shown in FIGS. 18A to 18D, in a condition where a first electrode film 12 and a first mask material 31 have been deposited in order over an Si substrate 10 on which gate insulating films 11, 21 are formed, the element isolation trenches 204a', 304a, 404a to form the STIs 204', 304, 404 are formed by the lithographic technique and the etching technique. In this case, the etching is performed with no etching selectivity between the gate insulating films 11, 21 and the Si substrate 10.

With no etching selectivity, the lower surfaces of the element isolation trenches 204a', 304a, 404a are located at the same position (depth) in the HV transistor region 102, the LV transistor region 103 and the cell region 104. In other words, the height from the upper surfaces of the gate insulating films 11, 21 to the bottom surfaces of the element isolation trenches 204a', 304a, 404a is equal in all the regions.

In the present embodiment as well, the upper surface of the STI 304 in the LV transistor region 103 is lower than the upper surface of the first electrode film 12 similarly to the upper surface of the STI 404 in the cell region 104. Therefore, the relation of the sectional areas of the STIs 204', 304, 404 in the channel length direction is "the STI 204' in the HV transistor region 102>the STI 304 in the LV transistor region 103=the STI 404 in the cell region 104".

Thus, according to the present embodiment, the bottom of the STI 204' of an HV transistor 201 can be lower than in the first embodiment (the STI 204). This advantage is that an inversion channel under the STI 204' in the HV transistor region 102 can be prevented, in addition to the advantage in the first embodiment. That is, while the production of crystal defects in the LV transistor is inhibited, an STI inversion leakage in the HV transistor can be reduced, and the formation of an inversion channel can be prevented under the STI 204'.

While the NAND-type flash memory has been described by way of example in the above embodiments, the present invention is not limited to this. For example, the present invention is also applicable to various semiconductor devices having different element isolation structures in an LV transistor region and an HV transistor region.

Moreover, without limiting to the PSZ film, it is possible to use various insulating films having high contraction stress as well as a coating film of, for example, non-doped silicate glass (NSG) or spin on glass (SOG).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:
1. A semiconductor device comprising:
    a semiconductor substrate including a first transistor region, a second transistor region, and a memory cell region;
    a first gate insulating film and a second gate insulating film, the first gate insulating film being provided in the first transistor region on the semiconductor substrate, the second gate insulating film being provided in the second transistor region on the semiconductor substrate and being smaller in thickness than the first gate insulating film;
    a plurality of first metal oxide semiconductor (MOS) transistors formed on the first gate insulating film and each of the first MOS transistors including a first gate electrode;
    a plurality of second MOS transistors formed on the second gate insulating film and each of the second MOS transistors including a second gate electrode;
    a plurality of memory cell transistors arranged in the memory cell region;
    a first element isolation region in the first transistor region, the first element isolation region being provided between the plurality of first MOS transistors;
    a second element isolation region in the second transistor region, the second element isolation region being provided between the plurality of second MOS transistors; and
    a third element isolation region provided in the memory cell region, wherein the upper surface of the second element isolation region is lower than the upper surface of the first element isolation region, and the upper surface and lower surface of the second element isolation region are equal in height to the upper surface and lower surface of the third element isolation region.

2. The semiconductor device according to claim 1, wherein the lower surface of the first element isolation region is equal to the lower surface of the second element isolation region.

3. The semiconductor device according to claim 1, wherein the lower surface of the first element isolation region is higher than the lower surface of the second element isolation region.

4. The semiconductor device according to claim 1, wherein the lower surface of the first element isolation region is higher than the lower surface of the second element isolation region by the difference of thickness between the first gate insulating film and the second gate insulating film.

5. The semiconductor device according to claim 1, wherein the first gate electrode includes a first electrode film, an intergate insulating film with an opening and formed on the first electrode film, a second electrode film formed on the intergate insulating film and in the opening,
an upper surface of the first electrode is equal to an upper surface of the third element isolation region.

6. The semiconductor device according to claim 5, wherein the second electrode film is formed on the first element isolation region and intergate insulating film continuously.

7. The semiconductor device according to claim 1, wherein the first to third element isolation regions include a PSZ film.

8. A semiconductor device comprising:
a semiconductor substrate including a first transistor region, a second transistor region, and a memory cell region;
a first gate insulating film, a second gate insulating film, and a third gate insulating film, the first gate insulating film being provided in the first transistor region on the semiconductor substrate, the second gate insulating film being provided in the second transistor region on the semiconductor substrate and being smaller in thickness than the first gate insulating film, the third gate insulating film being provided in the memory cell region on the semiconductor substrate and being equal in thickness to the second gate insulating film;
a plurality of first metal oxide semiconductor (MOS) transistors formed on the first gate insulating film and each of the first MOS transistors including a first gate electrode;
a plurality of second MOS transistors formed on the second gate insulating film and each of the second MOS transistors including a second gate electrode, the plurality second MOS transistors operating at a lower voltage than the plurality of first MOS transistors;
a plurality of memory cell transistors on the third gate insulating film and each including a third gate electrode;
a first element isolation region in the first transistor region, the first element isolation region being provided between the plurality of first MOS transistors;
a second element isolation region in the second transistor region, the second element isolation region being provided between the plurality of second MOS transistors,
a third element isolation region in the memory cell region, the third element isolation region being provided between the plurality of memory cell transistors,
wherein the upper surface of the second element isolation region is lower than the upper surface of the first element isolation region, and the upper surface and lower surface of the second element isolation region are equal in height to the upper surface and lower surface of the third element isolation region.

9. The semiconductor device according to claim 8, wherein the lower surface of the first element isolation region is equal to the lower surface of the second element isolation region.

10. The semiconductor device according to claim 8, wherein the lower surface of the first element isolation region is higher than the lower surface of the second element isolation region.

11. The semiconductor device according to claim 8, wherein the lower surface of the first element isolation region is higher than the lower surface of the second element isolation region by the difference of thickness between the first gate insulating film and the second gate insulating film.

12. The semiconductor device according to claim 8, wherein the first gate electrode includes a first electrode film, an intergate insulating film with an opening and formed on the first electrode film, a second electrode film formed on the intergate insulating film and in the opening,
an upper surface of the first electrode is equal to an upper surface of the third element isolation region.

13. The semiconductor device according to claim 8, wherein the first to third element isolation regions include a PSZ film.

* * * * *